United States Patent
Nath et al.

(10) Patent No.: US 12,205,943 B2
(45) Date of Patent: Jan. 21, 2025

(54) INTEGRATED CIRCUIT STRUCTURE WITH DIODE OVER LATERAL BIPOLAR TRANSISTOR

(71) Applicant: GlobalFoundries U.S. Inc., Malta, NY (US)

(72) Inventors: Anindya Nath, Essex Junction, VT (US); Alain F. Loiseau, Williston, VT (US); Souvick Mitra, Essex Junction, VT (US); Rajendran Krishnasamy, Essex Jucntion, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 243 days.

(21) Appl. No.: 17/890,725

(22) Filed: Aug. 18, 2022

(65) Prior Publication Data
US 2024/0063212 A1    Feb. 22, 2024

(51) Int. Cl.
*H01L 27/02* (2006.01)
*H01L 29/73* (2006.01)
(Continued)

(52) U.S. Cl.
CPC ...... *H01L 27/0255* (2013.01); *H01L 27/0259* (2013.01); *H01L 29/7302* (2013.01); *H01L 29/735* (2013.01); *H01L 29/7393* (2013.01)

(58) Field of Classification Search
CPC ............. H01L 27/0255; H01L 27/0259; H01L 27/0783; H01L 27/075; H01L 27/067; H01L 27/0676; H01L 27/0229–0244; H01L 27/0623; H01L 27/04; H01L 27/0647; H01L 27/082–0828;
(Continued)

(56) References Cited

U.S. PATENT DOCUMENTS 3,576,478 A * 4/1971 Watkins ................. H01L 29/00
  148/DIG. 136
4,322,821 A * 3/1982 Lohstroh ................ H10B 10/10
  257/51

(Continued)

FOREIGN PATENT DOCUMENTS

CN    104934381 A      9/2015
CN    107068744 A  *  8/2017  ......... H01L 27/0629

OTHER PUBLICATIONS

Chen et al., A lateral insulated gate bipolar transistor, Aug. 18, 2017, machine translation of CN 107068744A, pp. 1-8. (Year: 2017).*

(Continued)

*Primary Examiner* — Natalia A Gondarenko
(74) *Attorney, Agent, or Firm* — Francois Pagette; Hoffman Warnick LLC

(57) ABSTRACT

Embodiments of the disclosure provide an integrated circuit (IC) structure with a diode over a lateral bipolar transistor. A structure according to the disclosure may include a lateral bipolar transistor within a monocrystalline semiconductor over a substrate. An insulator layer is over a portion of the monocrystalline semiconductor. A diode is within a polycrystalline semiconductor on the insulator layer. A cathode of the diode is coupled to a first well within the monocrystalline semiconductor. The first well defines one of an emitter terminal and a collector terminal of the lateral bipolar transistor.

20 Claims, 3 Drawing Sheets

(51) Int. Cl.
*H01L 29/735* (2006.01)
*H01L 29/739* (2006.01)

(58) Field of Classification Search
CPC .......... H01L 27/11896; H01L 27/2445; H01L 27/0016; H01L 27/0296; H01L 27/0251; H01L 27/0288; H01L 27/0705–0738; H01L 27/0629; H01L 27/0802; H01L 27/101; H01L 29/4236; H01L 29/42352; H01L 29/66712; H01L 29/66734; H01L 29/66674; H01L 29/7801; H01L 29/7802; H01L 29/7813; H01L 25/043; H01L 25/065; H01L 25/0657; H01L 25/074; H01L 25/117; H01L 25/07; H01L 29/7834; H01L 29/866; H01L 29/0804–0834; H01L 29/1004; H01L 29/1008; H01L 29/41708; H01L 29/42304; H01L 29/7302; H01L 29/735; H01L 29/7393; H01L 29/66234–66348; H01L 29/73–7378; H01L 29/739–7398; H01L 2924/1305–13056; H01L 2924/1207; H01L 2924/1306; H01L 2924/13091
USPC .......... 257/140, 355, 367, 350, 557
See application file for complete search history.

(56) References Cited

U.S. PATENT DOCUMENTS

| | | |
|---|---|---|
| 6,645,820 B1 | 11/2003 | Peng et al. |
| 9,754,814 B2 | 9/2017 | Hurwitz |
| 2005/0035410 A1* | 2/2005 | Yeo .............. H01L 27/0814 257/E29.152 |
| 2006/0246653 A1* | 11/2006 | Bhattacharyya ....... H10B 12/00 438/237 |
| 2007/0070564 A1 | 3/2007 | Ma et al. |
| 2010/0084684 A1* | 4/2010 | Ito .............. H01L 29/7393 257/E29.197 |
| 2017/0126002 A1 | 5/2017 | Gittemeier |
| 2018/0012980 A1* | 1/2018 | Gu .............. H01L 29/402 |
| 2018/0358352 A1* | 12/2018 | Voldman .......... H01L 27/0255 |
| 2021/0066118 A1 | 3/2021 | Abou-Khalil et al. |
| 2021/0217850 A1 | 7/2021 | Stamper et al. |
| 2021/0280672 A1 | 9/2021 | Stamper et al. |
| 2021/0280699 A1 | 9/2021 | Nath et al. |
| 2021/0376159 A1 | 12/2021 | Abou-Khalil et al. |

OTHER PUBLICATIONS

U.S. Appl. No. 17/806,797, filed Jun. 14, 2022, 61 pages.

* cited by examiner

INTEGRATED CIRCUIT STRUCTURE WITH DIODE OVER LATERAL BIPOLAR TRANSISTOR

BACKGROUND

Field of the Invention

The present invention relates to integrated circuits (ICs) and, more particularly, to structures of a device layer in an IC.

Description of Related Art

Fails due to electrostatic discharge (ESD) may negatively affect the reliability of integrated circuits (ICs). IC designs typically include ESD protection devices (e.g., at input/output pads, at power pads, and between power domains). Semiconductor controlled rectifiers (SCRs) (e.g., silicon controlled rectifiers) are one type of an ESD device. In radio frequency (RF) circuits, large voltage swings may negatively affect junctions between terminals of opposite doping type ("p-n junctions"), thereby reducing voltage scaling and distorting harmonics in structures which feature several interconnected diodes. Such structures may include ESD protective structures (e.g., those used for RF switches), and thus may limit the protective functions of such devices.

SUMMARY

All aspects, examples and features mentioned herein can be combined in any technically possible way.

Embodiments of a structure disclosed herein provide a structure including: a lateral bipolar transistor within a monocrystalline semiconductor and over a substrate; an insulator layer over a portion of the monocrystalline semiconductor; and a diode within a polycrystalline semiconductor on the insulator layer, wherein a cathode of the diode is coupled to a first well within the monocrystalline semiconductor, the first well defining one of an emitter terminal and a collector terminal of the lateral bipolar transistor.

Another aspect of the disclosure includes any of the preceding aspects, and further includes an overlying insulator on the monocrystalline semiconductor, the overlying insulator including a first end adjacent the polycrystalline semiconductor, wherein the first well is horizontally between a trench isolation and the overlying insulator.

Another aspect of the disclosure includes any of the preceding aspects, and further includes a second well within the monocrystalline semiconductor, the second well defining the other of the emitter terminal and the collector terminal of the lateral bipolar transistor, wherein the second well is horizontally between a first trench isolation and an anode of the diode.

Another aspect of the disclosure includes any of the preceding aspects, and further includes an overlying insulator on the monocrystalline semiconductor, the overlying insulator including a first end adjacent the polycrystalline semiconductor, wherein the first well is horizontally between a second trench isolation and the overlying insulator, and wherein a separation distance between the first well and the cathode is larger than a separation distance between the second well and the anode.

Another aspect of the disclosure includes any of the preceding aspects, and further includes a resistive semiconductor material on the substrate and below the lateral bipolar transistor.

Another aspect of the disclosure includes any of the preceding aspects, and wherein the cathode and the first well have a same doping type.

Another aspect of the disclosure includes any of the preceding aspects, and wherein the cathode of the diode is coupled to the first well through an overlying metal wire.

Some embodiments of a structure disclosed herein provide a structure including: a lateral bipolar transistor within a monocrystalline semiconductor and over a substrate; a gate structure over a base region of the lateral bipolar transistor, the gate structure including: a gate insulator on the monocrystalline semiconductor; and a diode within a gate semiconductor on the gate insulator, wherein a cathode of the diode is coupled to a first well within the gate semiconductor, the first well defining one of an emitter terminal and a collector terminal of the lateral bipolar transistor.

Another aspect of the disclosure includes any of the preceding aspects, and further includes an overlying insulator on the monocrystalline semiconductor, the overlying insulator including a first end adjacent the gate structure, wherein the first well is horizontally between a trench isolation and the overlying insulator.

Another aspect of the disclosure includes any of the preceding aspects, and further includes a second well within the monocrystalline semiconductor, the second well defining the other of the emitter terminal and the collector terminal of the lateral bipolar transistor, wherein the second well is horizontally between a first trench isolation and an anode of the diode.

Another aspect of the disclosure includes any of the preceding aspects, and further includes an overlying insulator on the monocrystalline semiconductor, the overlying insulator including a first end adjacent the gate structure, wherein the first well is horizontally between a second trench isolation and the overlying insulator, and wherein a separation distance between the first well and the cathode is larger than a separation distance between the second well and the anode.

Another aspect of the disclosure includes any of the preceding aspects, and further includes a resistive semiconductor material on the substrate and below the lateral bipolar transistor.

Another aspect of the disclosure includes any of the preceding aspects, and wherein the cathode and the first well have a same doping type.

Another aspect of the disclosure includes any of the preceding aspects, and wherein the cathode of the diode is coupled to the first well through an overlying metal wire.

Additional embodiments of a structure disclosed herein provide a structure including: a lateral bipolar transistor within a monocrystalline semiconductor and over a substrate; an insulator layer over a portion of the monocrystalline semiconductor; and a first diode within a polycrystalline semiconductor on the insulator layer, wherein: a cathode of the diode is coupled to a first well within the monocrystalline semiconductor, the first well defining one of an emitter terminal and a collector terminal of the lateral bipolar transistor, and an anode of the diode is coupled to a second well within the monocrystalline semiconductor, wherein the second well has an opposite doping polarity relative to the first well such that a boundary between the first well and the second well define a second diode within the monocrystalline semiconductor.

Another aspect of the disclosure includes any of the preceding aspects, and further includes an insulator on the monocrystalline semiconductor, the insulator including a first end adjacent the polycrystalline semiconductor, wherein the first well is horizontally between a trench isolation and the insulator.

Another aspect of the disclosure includes any of the preceding aspects, and further includes a resistive semiconductor material on the substrate and below the lateral bipolar transistor.

Another aspect of the disclosure includes any of the preceding aspects, and wherein the cathode and the first well have a first doping type.

Another aspect of the disclosure includes any of the preceding aspects, and wherein the anode and the second well have second doping type opposite the first doping type.

Another aspect of the disclosure includes any of the preceding aspects, and wherein the cathode of the diode is coupled to the first well through a first metal wire, and wherein the anode of the diode is coupled to the second well through a second metal wire.

BRIEF DESCRIPTION OF THE DRAWINGS

The present invention will be better understood from the following detailed description with reference to the drawings, which are not necessarily drawn to scale and in which.

DETAILED DESCRIPTION

Electrostatic discharge (ESD) events may negatively impact the reliability of integrated circuits (IC)s. IC designs typically include ESD protection devices (e.g., at input/output pads, at power pads, and between power domains). SCRs (e.g., semiconductor controlled rectifiers) can be employed as ESD devices. In radio frequency (RF) circuits, large voltage swings may negatively affect junctions between terminals of opposite doping type ("p-n junctions"), thereby reducing voltage scaling and distorting harmonics in structures which feature several interconnected diodes. Such structures may include ESD protective structures (e.g., those used for RF switches), and thus may limit the protective functions of such devices.

Embodiments of a structure disclosed herein provide a structure including a diode over a lateral bipolar transistor. The lateral bipolar transistor may include two doped semiconductor regions (e.g., doped n-type) separated by a semiconductor region of the opposite doping type (e.g., doped p-type). The lateral bipolar transistor may be within a monocrystalline semiconductor and located over a substrate. An insulator layer is over a portion of the monocrystalline semiconductor. A diode, i.e., a junction between two oppositely doped semiconductor materials, is within a polycrystalline semiconductor and on the insulator layer. A cathode terminal of the diode is coupled to a first well within the monocrystalline semiconductor. The first well defines the emitter terminal or collector terminal of the lateral bipolar transistor. The anode terminal of the diode may be coupled to another component, e.g., through an overlying metal wire.

Although the diode is positioned vertically above the lateral bipolar transistor on one portion of a substrate, e.g., in a device layer, the diode and lateral bipolar transistor will function as distinct components during the operation of a product. Moreover, a conductive pathway may couple the cathode terminal of the diode to the emitter or collector of the lateral bipolar transistor to provide a serially coupled diode-bipolar transistor pair for ESD protection of a product. Among other technical benefits, embodiments of the disclosure occupy less surface area of a device layer by vertically stacking a diode and lateral bipolar transistor, rather than requiring the diode to be over a different portion of the substrate from the lateral bipolar transistor. The relative positions of the diode and lateral bipolar transistor may reduce capacitance and harmonics distortions during operation.

Figure 1:
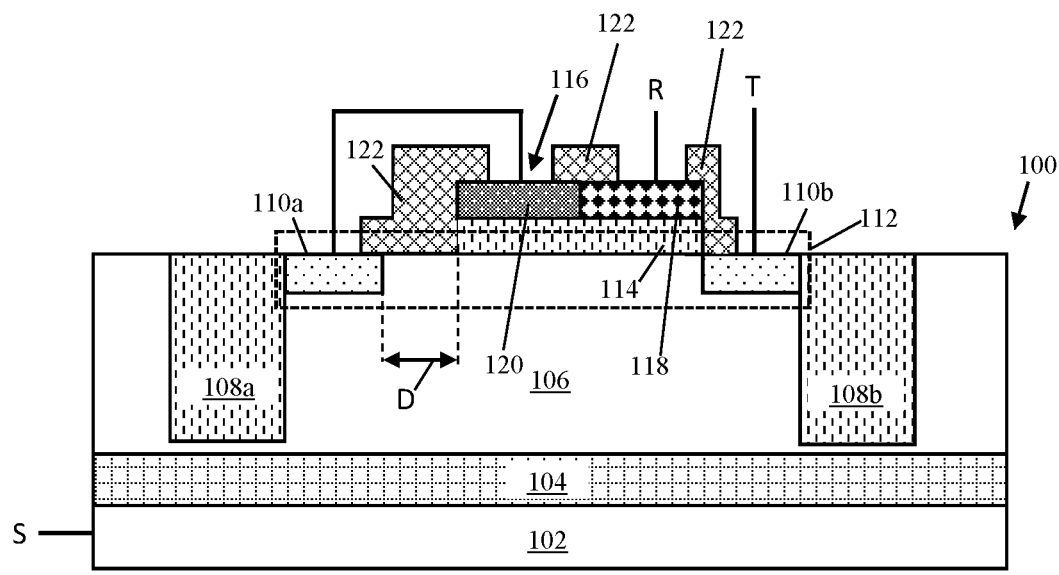
FIG. 1 depicts a cross-sectional view of a structure including a diode over a lateral bipolar transistor according to embodiments of the disclosure.

FIG. 1 depicts a cross-sectional view of a structure 100 according to embodiments of the disclosure. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various components (e.g., various doped wells, doped semiconductor materials, trench isolation regions, etc.) of structure 100 may be formed above a resistive semiconductor material 104 on substrate 102. Resistive semiconductor material 104 may be formed on or within substrate 102, e.g., by converting a portion of semiconductor material within substrate 102 into a higher-resistive material such as amorphous semiconductor (e.g., a-Si) or polycrystalline semiconductor (e.g., poly-Si). Resistive semiconductor material 104 may extend horizontally throughout substrate 102, and/or may be formed selectively under locations where doped materials are formed, examples of which are discussed elsewhere herein. In further implementations, resistive semiconductor material 104 may include oxygen doping to form a dielectric insulator or a buried oxide ("BOX") layer on substrate 102 to electrically isolate overlying doped semiconductor materials. In further implementations, resistive semiconductor material 104 may include other implanted elements or molecules such as Ge, N, or Si. However embodied, resistive semiconductor material 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive semiconductor material 104, and/or multiple layers of resistive semiconductor material(s) 104 may be formed within substrate 102 at various positions.

Portions of semiconductor material located above resistive semiconductor material 104 may be doped to a predetermined polarity (e.g., lightly doped p-type) and may be identified separately herein as a monocrystalline semiconductor 106. A monocrystalline semiconductor refers to a semiconductor material (e.g., silicon, silicon germanium, etc.) in which the crystal lattice of the entire solid is continuous, unbroken to its edges, and free of any grain boundaries. Such material may be known as a "single crystal semiconductor." In some cases, monocrystalline semiconductor 106 may be identified as a "deep well" for distinction from other, more highly doped regions and/or materials formed therein. Monocrystalline semiconductor 106 may have the same composition as substrate 102 and may be distinguished from substrate 102 solely based on its position above resistive semiconductor material 104.

Structure 100 may include one or more trench isolation (TI) regions 108, separately identified as TI 108a and TI 108b in respective positions. TI(s) 108a, 108b are included in structure 100, e.g., to electrically insulate various conductive and/or doped materials from each other in structure 100. TI(s) 108a, 108b may be formed by forming trenches (not shown) within monocrystalline semiconductor 106 and filling such trenches with an insulating material such as oxide, to isolate various materials within monocrystalline semiconductor 106 from another. TI(s) 108a, 108b may include various insulating materials, oxide and/or nitride insulators. According to one example, two TIs 108a, 108b are formed, but more or fewer TIs 108a, 108b may be formed in various embodiments discussed herein.

Monocrystalline semiconductor 106 may include multiple wells 110 therein, i.e., regions of semiconductor material having the same semiconductor composition but a different dopant polarity and/or concentration than that of monocrystalline semiconductor 106. A first well 110a may be within monocrystalline semiconductor 106 and may be adjacent TI 108a, or otherwise may be nearer to TI 108a than TI 108b. A second well 110b also may be within monocrystalline semiconductor 106 and may be adjacent TI 108b, or otherwise may be nearer to TI 108b than TI 108a. Wells 110a, 110b may have an opposite doping polarity from that of monocrystalline semiconductor 106 and may have a higher concentration of dopants therein. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/cm', and an energy of about 40 to 80 keV to produce a doping level of between 1E17 and 1E18 atoms/$cm^3$.

Regarding doping type and concentrations, monocrystalline semiconductor 106 may be doped p-type or n-type, and in an some implementations may be doped p-type. First well 110a and second well 110b each may have opposite polarity doping from that of monocrystalline semiconductor 106, i.e., they may be doped n-type when monocrystalline semiconductor 106 is doped p-type and vice-versa. The doping concentration of first well 110a and second well 110b may be higher than that of monocrystalline semiconductor 106. Nonetheless, monocrystalline semiconductor 106 and wells 110a, 110b together define the three alternating polarity doped regions of a lateral bipolar transistor 112 in structure 100. First well 110a and second well 110b, each may provide an emitter or collector ("E/C") terminal of the lateral bipolar transistor, whereas monocrystalline semiconductor 106 defines provides the base terminal between the emitter and collector terminals. Due to the presence of substrate 102 below monocrystalline semiconductor 106, and resistive semiconductor material 104 therebetween, a voltage in diode 116 above lateral bipolar transistor 112 will bias and thereby induce a current flow within substrate 102 at terminal S (e.g., due to parasitic capacitance across resistive semiconductor material 104). Hence, the voltage in diode 116 may control whether current flows from first well 110a to second well 110b within lateral bipolar transistor 112. Notably, all portions of lateral bipolar transistor 112 are located within or below monocrystalline semiconductor 106, thereby enabling structure 100 to include additional devices as discussed herein.

In some implementations, structure 100 may include an insulator layer 114 on a portion of monocrystalline semiconductor 106, e.g., an area of monocrystalline semiconductor 106 that is horizontally between first well 110a and second well 110b. Insulator layer 114 may include any currently known or later developed insulative material, e.g., various oxide and/or nitride insulators, and thus may have the same composition as TI(s) 108a, 108b or similar insulative materials. Insulator layer 114 may be formed, e.g., by forming a mask (not shown) over monocrystalline semiconductor 106 and TI(s) 108a, 108b, depositing insulative material to create insulator layer 114, and thereafter removing the mask and excess insulator material to leave insulator layer 114 intact. The vertical thickness of insulator layer 114 may be controlled based on the device where structure 100 will be used, and in an example insulator layer 114 may be approximately twenty micrometers ($\mu$m) thick.

Structure 100 may include a diode 116 on insulator 114, and above lateral bipolar transistor 112. A diode is a two-terminal semiconductor device which, during operation, will allow current to flow from one terminal to another (i.e., from anode to cathode) but will prevent current from flowing in the opposite direction. Diode 116 may be in the form of a "P-N junction diode," having an electrical barrier at an interface between n-type doped and p-type doped semiconductor materials. Diode 116 of structure 100 may include a layer of semiconductor material having two different doping types. Alternatively, diode 116 could be any other suitable type of diode (e.g., a PIN diode, an avalanche diode, etc.). In some cases, diode 116 may include polycrystalline silicon ("p-silicon" or also known as "polysilicon"), and/or other currently known or later developed semiconductor materials used to form a gate structure or similar components on a device layer. Diode 116 may include an anode 118 having a particular doping type (e.g., p-type doping) located adjacent a cathode 120 having the opposite doping type (e.g., n-type doping where anode 118 is doped p-type or vice-versa). Anode 118 may be coupled to an input node "R," e.g., through a vertically extending conductor ("via") and/or any other conductive element for coupling two or more materials on a device layer. Cathode 120 may be coupled to first well 110a, e.g., through a combination of metal wires or vias and/or any other conductive pathway for interconnecting cathode 120 to first well 110a. Cathode 120 and first well 110a may have a same doping type, e.g., each may be doped n-type to prevent additional diode junctions from forming between lateral bipolar transistor 112 and diode 116. An output node "T" may couple to second well 110b to ground or another device node in a similar manner to anode 118, e.g., through a via and/or other conductor, thus defining the input and output terminals for lateral bipolar transistor 112 and diode 116.

To reduce the risk of electrical interference between lateral bipolar transistor 112 and diode 116, lateral bipolar transistor 112 may not be symmetric about the location of diode 116. For example, first well 110a may be separated from one horizontal end of insulator layer 114 by a separation distance D (e.g., approximately ten μm), whereas second well 110b may be horizontally adjacent an opposite horizontal end of insulator layer 114 or otherwise may be closer to insulator layer 114 than separation distance D. The presence of separation distance D may create a "drift region" within monocrystalline semiconductor 106, e.g., to reduce current leakage through lateral bipolar transistor 112 when an ESD event is not occurring, and/or to modify the trigger voltage needed to enable current flow through lateral bipolar transistor 112.

To prevent electrical shorts from forming between lateral bipolar transistor 112 and diode 116, structure 100 may include a set of overlying insulators 122 on various portions of monocrystalline semiconductor 106. Overlying insulators 122 may have the same and/or similar materials to those within TIs 108a, 108b, e.g., various oxide and/or nitride insulators. Overlying insulators 122 may be formed by conformal deposition of insulative materials on exposed surfaces of insulator layer 114 and diode 116, following by targeted removal of insulator in locations where conductors to wells 110a, 110b, anode 118, and/or cathode 120 are formed.

Figure 2:
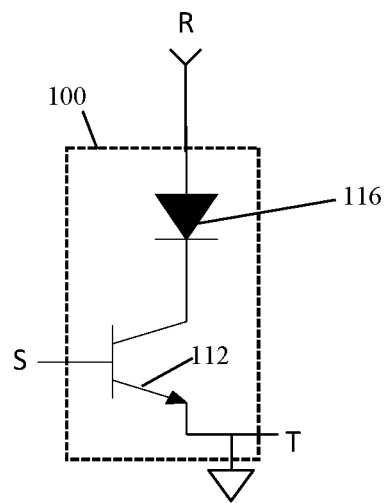
FIG. 2 depicts a schematic diagram of the diode coupled to the lateral bipolar transistor according to embodiments of the disclosure.

FIG. 2, discussed briefly, provides a schematic diagram of the equivalent circuit provided by embodiments of structure 100 during operation of a device. As shown, diode 116 couples input terminal R to the emitter or collector terminal of lateral bipolar transistor 112. The current at node S may control whether current leaving diode 116 passes through lateral bipolar transistor 112 to output terminal T. During an ESD event, substrate 102 (FIG. 1) may experience a significant current and thus may enable current to pass through lateral bipolar transistor 112 during the ESD event. Hence, structure 100 allows diode 116 to be structurally integrated with lateral bipolar transistor 112 to protect against ESD events, without diode 116 being formed in spaces laterally outside the location of lateral bipolar transistor 112. The schematic diagram illustrated in FIG. 2 may reflect the structure and operation of structure 100 regardless of whether certain optional and/or additional features, discussed herein, are also included.

Figure 3:
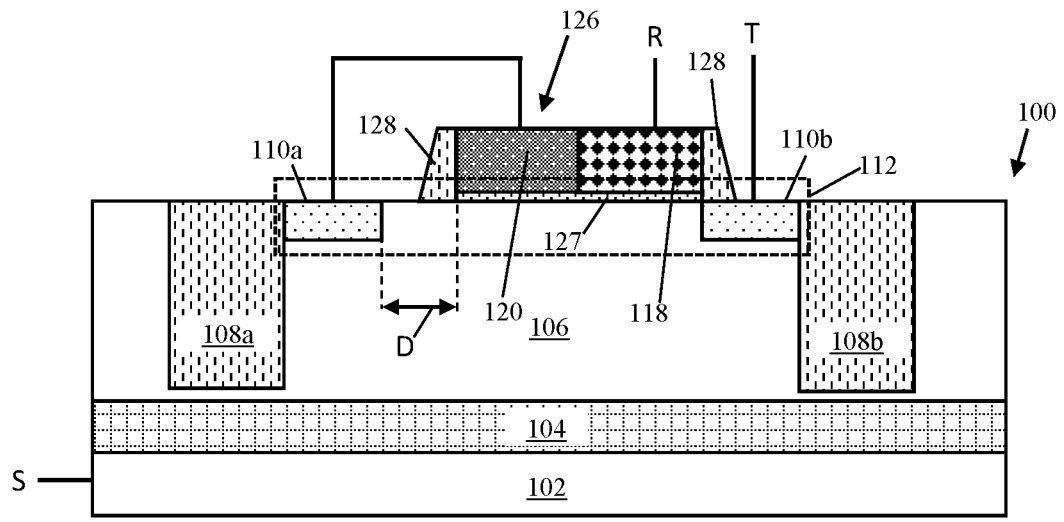
FIG. 3 depicts a cross-sectional view of a structure including a diode within a gate structure over a lateral bipolar transistor according to embodiments of the disclosure.

Turning to FIG. 3, embodiments of structure 100 optionally may be formed using a gate structure 126, e.g., similar to those used in metal oxide semiconductor field effect transistor (MOSFET) devices. Gate structure 126 may be integrated into structure 100 for processing compatibility with other structures of a device layer with similar gate structures therein. Gate structure 126 may include, e.g., a gate dielectric layer 127 on monocrystalline semiconductor 106 and horizontally between wells 110a, 110b. Gate dielectric layer 127 may include, e.g., a dielectric layer with a high dielectric constant ("high-k," indicating a k value of at least approximately 3.9) or any other layer of suitable gate dielectric material (e.g., SiO2, etc.) and may have a smaller vertical thickness than insulator layer 114 (FIG. 1) in some implementations. In various implementations, gate dielectric layer 127 may have a vertical thickness as small as approximately 3.0 nm or may have a larger thickness of, e.g., approximately 40 nm. Diode 116 may be on gate dielectric layer 127 and may include anode 118 adjacent cathode 120 as discussed elsewhere herein. Gate structure 126 further may include a set of spacers 128 on sidewalls of gate dielectric layer 127 and diode 116. Spacers 128 may have the same composition and/or similar compositions to other insulative materials discussed herein and may be prevent conductive pathways from forming to any components that are adjacent to gate structure 126. Despite the presence of gate structure 126 and spacers 128, structure 100 may be structurally and operationally similar or identical to other embodiments of structure 100 discussed herein.

Figure 4:
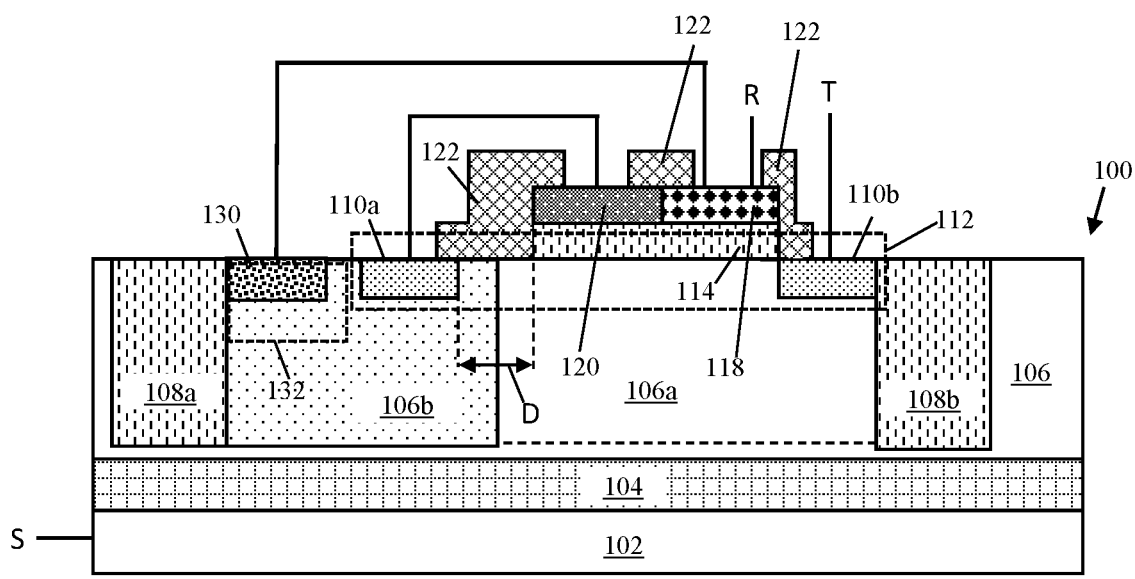
FIG. 4 depicts a cross-sectional view of a structure including multiple diodes coupled to a lateral bipolar transistor according to embodiments of the disclosure.

Referring now to FIG. 4, further embodiments of structure 100 may include multiple diodes electrically coupled in parallel with each other, and serially coupled to the emitter or collector terminal of lateral bipolar transistor 112. In such an example, monocrystalline semiconductor 106 of structure 100 may include a first deep well 106a having a particular doping type (e.g., p-type doping), in addition to a second deep well 106b having the opposite doping type (e.g., n-type doping where first deep well 106a is p-type or vice versa). In this case, first well 110a may be within second deep well 106b, and first well 110a may have the same doping type as second deep well 106b but in a higher concentration. Moreover, lateral bipolar transistor 112 may include portions of first well 110a, deep wells 106a, 106b, and second well 110b while continuing to provide an alternating n-p-n or p-n-p doped semiconductor regions.

Second deep well 106b additionally may include a third well 130 that has an opposite doping polarity relative to first well 110a and second deep well 106b. In addition, third well 130 may have the same doping type as anode 118 (e.g., both may be doped p-type in the case where second deep well 106b and first well 110a are doped n-type, or vice-versa). Anode 118 may be coupled, e.g., through overlying metal wires or vias, to third well 130 to form an electrical coupling that is parallel to first diode 116. The physical junction between third well 130 and second deep well 106 may form, e.g., a second diode 132 that is electrically in parallel with diode 116. Second diode 132 may include portions of the emitter or collector terminal of lateral bipolar transistor 112, such that second diode 132 does not interfere with the structure or operation of lateral bipolar transistor 112. Structure 100 otherwise may be similar or identical to other implementations discussed herein. In still further implementations, structure 100 may include gate structure 126 (FIG. 3) together with second deep well 106b, third well 130, and second diode 132.

Figure 5:
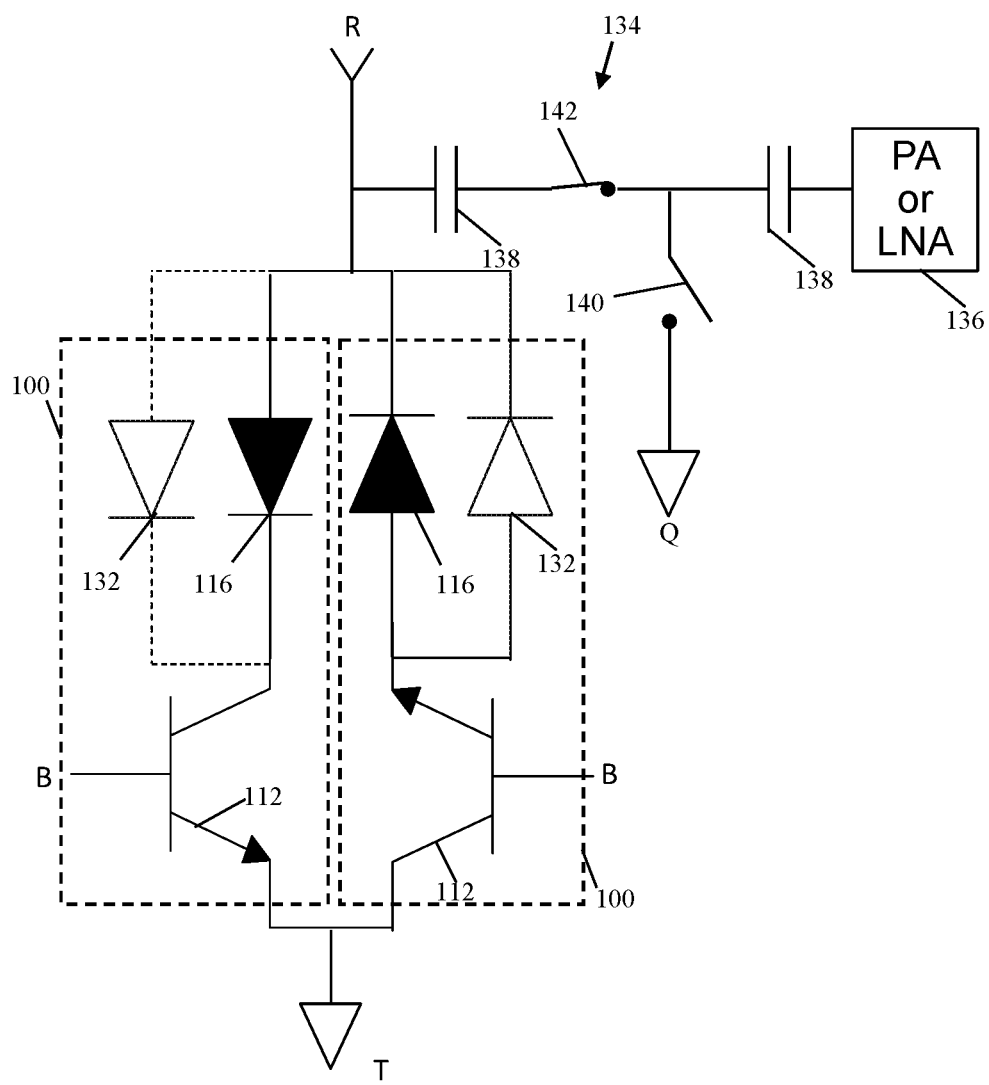
FIG. 5 depicts a schematic diagram of an electrostatic discharge (ESD) protective circuit including one or more diodes and lateral bipolar transistors according to embodiments of the disclosure.

FIG. 5 depicts a schematic diagram of a circuit 134 including several implementations of structure 100 (e.g., two shown) therein. Each implementation of structure 100 may couple input node R to output node T, e.g., to define a current pathway for bypassing other components of circuit 134 during an ESD event. Each structure 100 in circuit 134 optionally may include second diode 132 (shown in dashed lines) connected to lateral bipolar transistor 112 in parallel with diode 116. Hence, each structure 100 may include second diode 132 therein. Structures 100 may have opposite polarities (e.g., as shown by the orientation of diodes 116, 132 and lateral bipolar transistors 112 in each structure 100 of FIG. 5) to account for ESD events inducing a high magnitude voltage of positive or negative polarity. Circuit 134 may include, e.g., an amplifier component 136 such as a power amplifier ("PA") or low noise amplifier ("LNA") for converting a signal from input terminal R to an amplified signal. A capacitive junction 138 may couple amplifier component 136 to an RF switch 140 for selectively coupling amplifier component 136 to one or more additional component through node "Q." An ESD switch 142 may couple input terminal R to RF switch through another capacitive junction 138, thus allowing current to flow through structure (s) 100 when an ESD event enables current flow through structure(s) 100. A voltage strike or similar event affecting circuit 134 will induce current flow through diode(s) 116, 132 of structure(s) 100, thereby enabling current flow through lateral bipolar transistors 112 as discussed herein. When the ESD event ends, the voltage applied to lateral bipolar transistors 112 may fall to a level which prevents further passage of current through structure(s) 100. Various features of structures 100, e.g., separation distance D, the size and location of diodes 116, 132 may impede or otherwise prevent leakage currents through structures 100 when an ESD event does not occur.

Embodiments of the disclosure provide various technical and commercial advantages, examples of which are discussed herein. The presence of diodes 116, 132 serially coupled to and/or over lateral bipolar transistor(s) 112 causes structure 100 to exhibit lower capacitance, harmonics distortion, and/or leakage current, and thus less structural degradation during ESD events. These advantages may be especially pronounced when structure(s) 100 are implemented in radio frequency (RF) devices, e.g., those with amplifier component(s) 136 therein. Structure 100 moreover, is compatible with existing manufacturing processes, any only requires portions of overlying semiconductor material to be converted into a diode (e.g., by targeted deposition and/or doping) partway through other processing methods. Structure 100 is also combinable with processes to form MOSFET transistors on a device, e.g., by forming diode 116 in gate structure 126 (FIG. 3) as discussed herein. Embodiments of the disclosure, in addition, require less surface area than would otherwise be required to provide a diode and lateral bipolar transistor.

In the description of the structure embodiments above, reference is made to semiconductor features including, but not limited to, substrates, layers, regions, portions, terminals, etc. and to the conductivity types (e.g., P-type or N-type) of those features. Such features are made up of one or more semiconductor materials and a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve the different conductivity types (e.g., P-type conductivity and N-type conductivity) and the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant (s) in each semiconductor region.

The terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a lateral bipolar transistor within a monocrystalline semiconductor and over a substrate, wherein the lateral bipolar transistor includes a first well and a second well adjacent opposite lateral ends of the monocrystalline semiconductor and each defining one of an emitter and a collector of the lateral bipolar transistor;
    an insulator layer over a portion of the monocrystalline semiconductor, wherein the first well is horizontally separated from a first horizontal end of the insulator layer by a separation distance, and a second horizontal end of the insulator layer is directly horizontally adjacent the second well; and
    a diode within a polycrystalline semiconductor on the insulator layer and having sidewalls substantially aligned with sidewalls of the insulator layer such that the lateral bipolar transistor is asymmetric about the diode, wherein a cathode of the diode is coupled to the first well.

2. The structure of claim 1, further comprising an overlying insulator on the monocrystalline semiconductor, the overlying insulator including a first end adjacent the polycrystalline semiconductor, wherein the first well is horizontally between a trench isolation and the overlying insulator.

3. The structure of claim 1, further comprising an overlying insulator on the monocrystalline semiconductor, the overlying insulator including a first end adjacent the polycrystalline semiconductor, wherein the first well is horizontally between a second trench isolation and the overlying insulator.

4. The structure of claim 1, further comprising a resistive semiconductor material on the substrate and below the lateral bipolar transistor.

5. The structure of claim 1, wherein the cathode and the first well have a same doping type.

6. The structure of claim 1, wherein the cathode of the diode is directly coupled to the first well through an overlying metal wire.

7. A structure comprising:
    a lateral bipolar transistor within a monocrystalline semiconductor and over a substrate, wherein the lateral bipolar transistor includes a first well and a second well adjacent opposite lateral ends of the monocrystalline semiconductor and each defining one of an emitter and a collector of the lateral bipolar transistor;
    a gate structure over a base region of the lateral bipolar transistor, the gate structure including:
        a gate insulator on the monocrystalline semiconductor, wherein the first well is horizontally separated from a first horizontal end of the gate insulator by a first separation distance, and a second horizontal end of the gate insulator is directly horizontally adjacent the second well; and
        a diode within a gate semiconductor on the gate insulator, wherein a cathode of the diode is coupled to the first well within the gate semiconductor; and
        a pair of gate spacers on opposite horizontal ends of the gate insulator and diode, wherein the first well is horizontally separated from a first gate spacer of the pair by a second separation distance, and a second gate spacer of the pair is on the second well such that the lateral bipolar transistor is asymmetric about the gate structure.

8. The structure of claim 7, further comprising an overlying insulator on the monocrystalline semiconductor, the overlying insulator including a first end adjacent the gate structure, wherein the first well is horizontally between a trench isolation and the overlying insulator.

9. The structure of claim 7, further comprising an overlying insulator on the monocrystalline semiconductor, the overlying insulator including a first end adjacent the gate structure, wherein the first well is horizontally between a second trench isolation and the overlying insulator.

10. The structure of claim 7, further comprising a resistive semiconductor material on the substrate and below the lateral bipolar transistor.

11. The structure of claim 7, wherein the cathode and the first well have a same doping type.

12. The structure of claim 7, wherein the cathode of the diode is directly coupled to the first well through an overlying metal wire.

13. A structure comprising:
    a lateral bipolar transistor within a monocrystalline semiconductor and over a substrate, wherein the lateral bipolar transistor includes a first well and a second well within the monocrystalline semiconductor and each defining one of an emitter and a collector of the lateral bipolar transistor;
    an insulator layer over a portion of the monocrystalline semiconductor, wherein the first well is horizontally separated from a first horizontal end of the insulator layer by a separation distance, and a second horizontal end of the insulator layer is directly horizontally adjacent the second well;
    a first diode within a polycrystalline semiconductor on the insulator layer and having sidewalls substantially aligned with sidewalls of the insulator layer such that the lateral bipolar transistor is asymmetric about the first diode; and
    a second diode within the monocrystalline semiconductor and including:
        a deep well; and
        a third well within the deep well,
        wherein the deep well and the third well have opposite doping polarities, the first well being within and having a same doping polarity as the deep well, and wherein:
        a cathode of the first diode is coupled to the first well within the monocrystalline semiconductor, and
        an anode of the first diode is coupled to the third well within the monocrystalline semiconductor, wherein the second well has an opposite doping polarity relative to the deep well such that a boundary between the deep well and the third well define the second diode within the monocrystalline semiconductor.

14. The structure of claim 13, further comprising an insulator on the monocrystalline semiconductor, the insulator including a first end adjacent the polycrystalline semiconductor, wherein the first well is horizontally between a trench isolation and the insulator.

15. The structure of claim 13, further comprising a resistive semiconductor material on the substrate and below the lateral bipolar transistor.

16. The structure of claim 13, wherein the cathode of the first diode and the first well have a first doping type.

17. The structure of claim 16, wherein the anode of the first diode and the second well have second doping type opposite the first doping type.

18. The structure of claim 13, wherein the cathode of the first diode is directly coupled to the first well through a first metal wire, and wherein the anode of the first diode is directly coupled to the second well through a second metal wire.

19. The structure of claim 1, wherein the second end of the insulative layer is vertically aligned with a sidewall of the second well.

20. The structure of claim 13, wherein the second end of the insulative layer is vertically aligned with a sidewall of the second well.

\* \* \* \* \*